United States Patent [19]
LaGuardia

[11] 3,959,745
[45] May 25, 1976

[54] PULSE AMPLITUDE MODULATOR

[75] Inventor: Lawrence LaGuardia, Ellicott City, Md.

[73] Assignee: The United States of America as represented by the Secretary of the Army, Washington, D.C.

[22] Filed: June 24, 1975

[21] Appl. No.: 589,740

[52] U.S. Cl. .............................. 332/11 D; 332/9 T
[51] Int. Cl.² ...................................... H03K 13/22
[58] Field of Search .................. 332/9, 9 T, 11 D

[56] References Cited
UNITED STATES PATENTS

| | | | |
|---|---|---|---|
| 3,500,205 | 3/1970 | Tudor-Owen | 332/11 D |
| 3,500,441 | 3/1970 | Brolin | 332/11 D |
| 3,506,917 | 4/1970 | Bond | 332/11 D |
| 3,555,423 | 1/1971 | Weston | 332/11 D |
| 3,699,566 | 10/1972 | Schindler | 332/11 D |
| 3,723,909 | 3/1973 | Condon | 332/11 D |
| 3,727,135 | 4/1973 | Holzer | 332/11 D |
| 3,761,841 | 9/1973 | Jacquart | 332/11 D |
| 3,815,033 | 6/1974 | Tewksbury | 332/11 D |
| 3,878,465 | 4/1975 | Stephenne | 332/11 D |
| 3,879,663 | 4/1975 | McGrogan, Jr. | 332/11 D |

Primary Examiner—John Kominski
Attorney, Agent, or Firm—John R. Utermohle; Thomas O. Maser

[57] ABSTRACT

A pulse amplitude modulator which has particular utility in analog-to-digital and digital-to-analog converters of the continuous variable slope delta (CVSD) modulation type. A CVSD analog-to-digital modulator first compares an incoming analog signal with a synthesized signal. The error signal is periodically sampled, with the output of the sampler being a clocked binary signal having the same polarity as the error signal. This binary signal, which is the output signal for the CVSD modulator, is simultaneously tested for patterns of similar bits and utilized to correct the amplitude of the synthesized signal in the pulse amplitude modulator. The pulse amplitude modulator utilizes C-MOS transmission gates and filter circuitry to synthesize a digital signal which, when integrated, approximates the analog input signal.

3 Claims, 6 Drawing Figures

PULSE AMPLITUDE MODULATOR

BACKGROUND OF THE INVENTION a. Field of the Invention

This invention relates generally to the field of signal processing, and more specifically to pulse amplitude modulators for use in the analog-to-digital and digital-to-analog conversion of a signal by the process known as continuous variable slope delta (CVSD) modulation.

b. Description of the Prior Art

Continuous variable slope delta modulation and pulse amplitude modulators for use therein are known in the prior art. CVSD is an analog-to-digital and digital-to-analog conversion technique which exploits the syllabic characteristics of speech to minimize the number of bits required in its digital representation. Because CVSD is a mono-bit system, the coding and decoding processes do not require timing information of a higher order than for recovery of the individual bits. That is, unlike in such techniques as pulse code modulation, framing information is not required. Two elements normally associated with the CVSD system include what will be called in this description a slope command and a pulse amplitude modulator. Prior art embodiments of these elements require an operational amplifier, balancing potentiometers, and various configurations of resistors, capacitors and control voltages. Those prior art pulse amplitude modulators known to the inventor require at least two control voltages and consume significant amounts of power.

BRIEF SUMMARY OF THE INVENTION

It is an object of this invention to provide a pulse amplitude modulator suitable for use in a CVSD modulation system and which operates with a significantly reduced power requirement from those known in the prior art.

It is a further object to provide a pulse amplitude modulator requiring only a single biasing voltage for operation.

It is a still further object to provide a pulse amplitude modulator which may be manufactured at reduced cost and with increased reliability.

It is also an object to provide a pulse amplitude modulator having balanced + and − output levels.

A pulse amplitude modulator having these and other advantages might include: (1) a source of first digital signals representative of the polarity of the error between a first analog signal and a second, synthesized, analog signal; (2) a source of second digital signals representative of the presence or absence of a predetermined number of like consecutive bits within the first digital responsive (3) an output terminal, (4) a capacitor circuit resonsive to the second digital signals and including means for generating and storing a first voltage, $V_H$, the voltage increasing at a predetermined rate when a presence of like consecutive bits is detected and decreasing when an absence of like consecutive bits is detected, and means for generating and storing a second voltage, $V_L$, the voltage decreasing at a predetermined rate when a presence of like consecutive bits is detected and increasing when an absence of like consecutive bits is detected; and (5) means responsive to the first digital signals for selectively routing $V_H$ or $V_L$ to the output terminal, the choice of selection being determined by the polarity of the error.

BRIEF DESCRIPTION OF THE DRAWINGS

The invention, and the description thereof, may be better understood when considered in connection with the drawings in which.

DESCRIPTION OF THE PREFERRED EMBODIMENT

Figure 1:
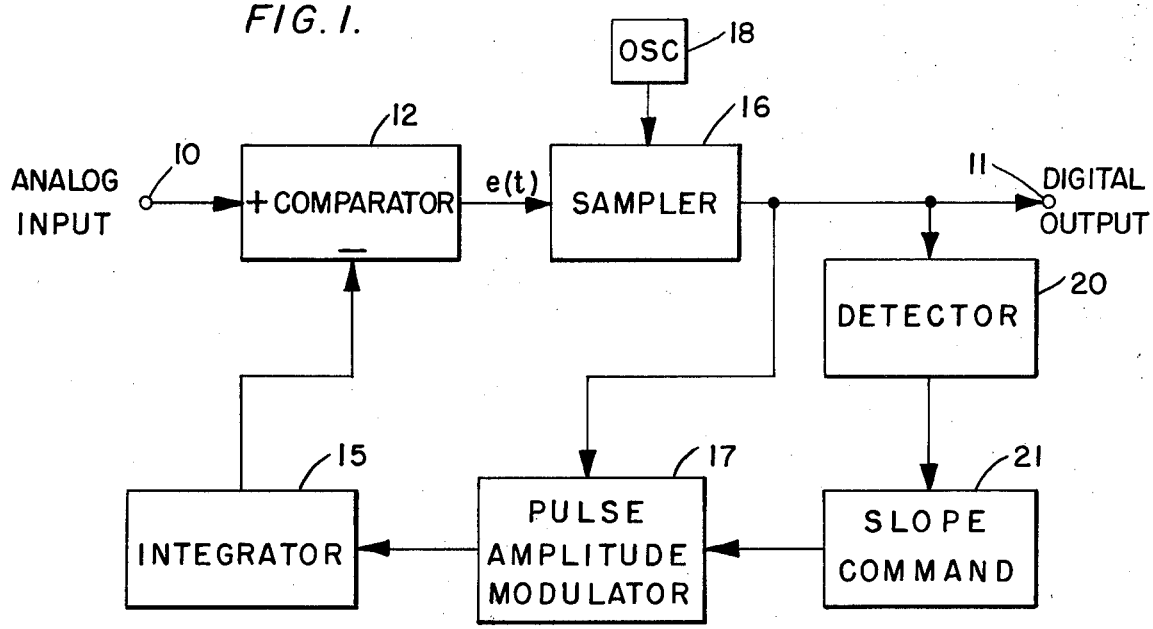
FIG. 1 is a block diagram of the encoder portion of a CVSD modulator embodying the invention.

Referring to FIG. 1, the encoder portion of a continuous variable slope delta modulator acts on an analog signal received at an input terminal 10, and provides at its output 11 a digital pulse train from which a signal substantially identical to the analog input signal may be reconstructed. A comparator circuit 12 compares signals received from audio input terminal 10 and an integrator circuit 15. A signal $e(t)$ from the comparator 12 is passed to a sampler circuit 16, which provides a digital output of the encoder, clocked by an oscillator 18, to terminal 11 and to a pulse amplitude modulator circuit 17. In addition, the sampler output is passed through a detector circuit 20 and a slope command circuit 21 to the pulse amplitude modulator circuit 17. The modulator circuit 17 provides an input to the integrator circuit 15 which is connected to the comparator circuit 12. The comparator circuit 12 compares the analog input provided to terminal 10 with the previously reconstructed analog signal from the integrator circuit 15. The result of this comparison is an unclocked digital error signal limited in the direction of the sign of the greater input signal. Specifically, if the analog input signal is provided to the + input of the comparator and if the integrator signal is provided to the − input, the signal $e(t)$ will have a + polarity of the input signal is greater than the integrator signal and will have a − polarity if the integrator signal is greater. The signal is sampled at a specific data rate by the sampler circuit 16, the output being a clocked binary signal having the same polarity as the error signal provided to the input of the sampler 16 at the time of the clock pulse. The sampler output is the digital output of the encoder, provided to terminal 11. The detector circuit 20 monitors the binary output signal to determine when the polarity of the error signal from the comparator 12 remains unchanged for a predetermined number of clock pulses, the number being three for purposes of this example. When three like consecutive bits have been detected, the output of the detector 20 communicates this condition to the slope command circuit 21, which in turn signals the pulse amplitude modulator 17 to increase the amplitude of the synthesized signal as appropriate. The output of the modulator 17 is smoothed by the integrator circuit 15 before being compared with the analog input by the comparator 12. The output of the CVSD encoder of FIG. 1 is a binary signal at terminal 11 from which one can reconstruct an analog signal which is substantially identical to the input signal.

Figure 2:
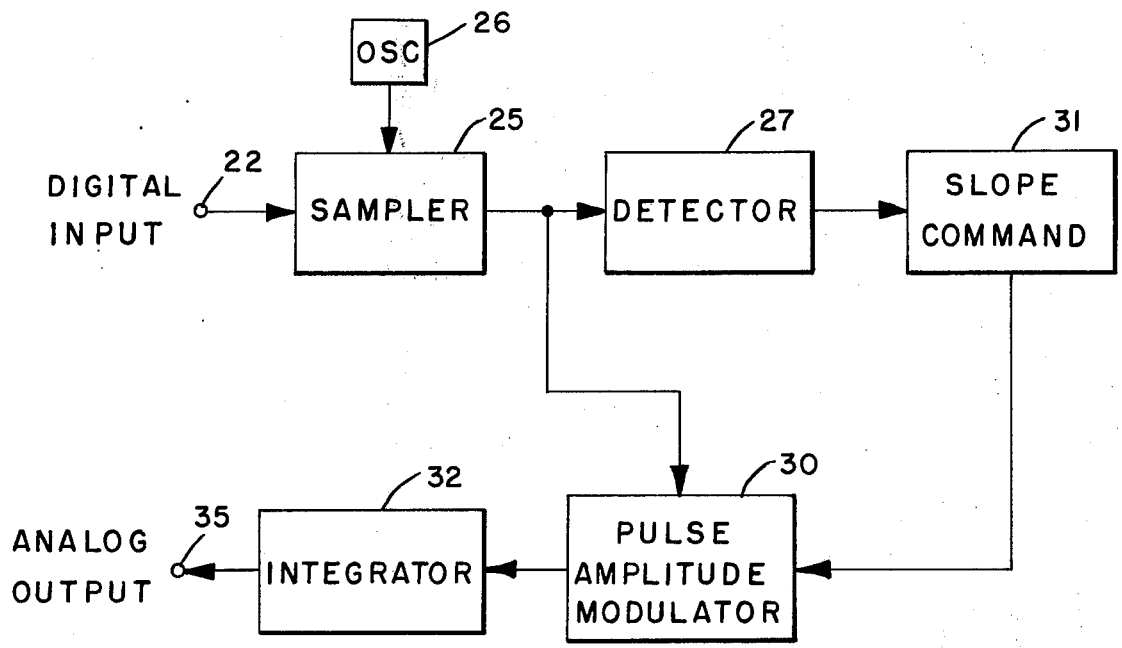
FIG. 2 is a block diagram of the decoder portion of a CVSD modulator embodying the invention.

The circuit of FIG. 2 is a decoder for re-creating an analog input given the digital output generated by the circuit of FIG. 1. A digital input is provided at terminal 22 to a sampler circuit 25. Clock pulses provided by an oscillator 26 regulate the output of data flowing from the sampler to a detector circuit 27 and to a pulse amplitude modulator circuit 30. Information from the detector circuit 27 is provided to a slope command circuit 31, which also provides a signal to the pulse amplitude modulator 30. Signals from the pulse amplitude modulator 30 are smoothed by an integrator 32 and provided to an analog output terminal 35. The various elements of the circuit of FIG. 2 operate in a substantially identical manner to their counterparts in FIG. 1. The sampler 25 provides a clocked digital output whose rate is determined by clock pulses from the oscillator 26. This output is provided to a detector circuit 27 which detects, in this preferred embodiment, three consecutive bits having like polarity. The output of the detector is a binary signal clocked at the rate provided by the oscillator 26, the output being 1 for one clock period following the detection of three like bits and 0 at all other times. A slope command circuit 31 receives information from the detector and provides a voltage regulated output to a pulse amplitude modulator circuit 30. Specifically, when the output of the detector is 1, the output of the slope command circuit 31 increases at a predetermined rate, and when the output of the detector 31 is 0, the voltage output of the slope command circuit 31 decreases at a predetermined rate. This rate is related to the function of the syllabic rate of speech and is independent of the sampling rate. A pulse amplitude modulator circuit 30 receives information from the sampler 25 and the slope command circuit 31 to create a signal whose amplitude is determined by the output of the slope command circuit 31, and whose polarity is determined by the output of the sampler circuit 25. An integrator circuit 32 receives a signal from the modulator 30 and produces a reconstructed analog signal which closely approximates the input analog signal provided on terminal 10 of the encoder of FIG. 1.

Figure 3:
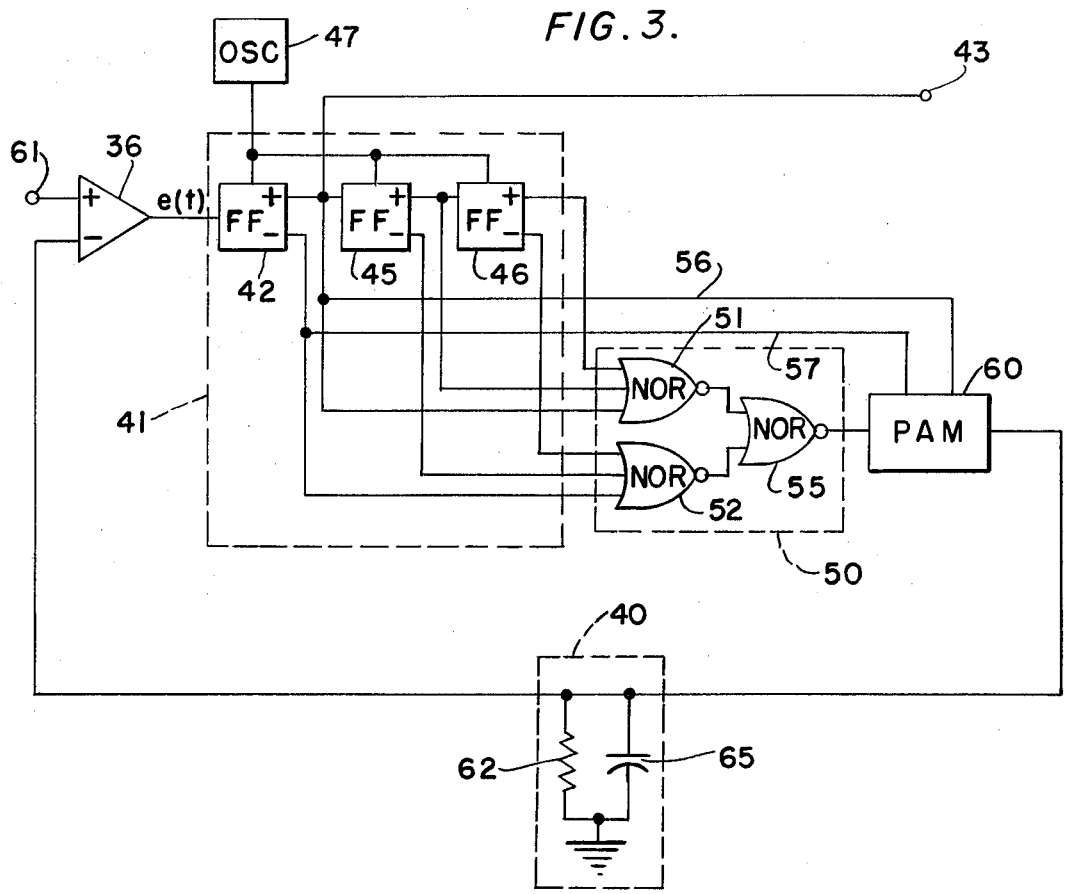
FIG. 3 is a more detailed diagram of the encoder of FIG. 1, including logic diagrams of certain portions thereof.

FIG. 3 again shows the encoder of FIG. 1, illustrating several of the elements in logic diagram form. A comparator circuit 36, such as a model $\mu$A709 produced by Fairchild Semiconductors, receives an analog signal from terminal 61 at its positive input and an integrated synthesized signal from an integrator 40 on its negative input. The output is an error signal e(t) whose sign is determined by whether the synthesized signal is greater than or less than the analog input. The error signal is then provided to a sampler circuit 41. In this preferred embodiment, the sampler includes three flip-flops 42, 45 and 46 which are clocked by pulses from an oscillator 47. The flip-flop 42, upon receipt of a clock pulse, stores a signal indicative of the sign of the error signal e(t) from the comparator 36. The value stored in flip-flop 42 is also provided to an output terminal 43, which is the output of the encoder circuit. On the next clock pulse the contents of flip-flop 42 is shifted into flip-flop 45 as the current error from the comparator 36 is stored in the flip-flop 42. Similarly, on the next clock pulse the contents of flip-flop 45 is transferred to flip-flop 46, the contents of flip-flop 42 is transferred to flip-flop 45, and the signal indicating the sign of the error from comparator 36 is stored in flip-flop 42. A detector circuit 50, which in this embodiment includes three NOR gates 51, 52 and 55, operates on information provided from the flip-flops of the sampler 41. A first NOR gate 51 receives inputs from positive output terminals of each of the three flip-flops 42, 45 and 46. A NOR gate 52 receives signals from negative outputs of the three flip-flops 42, 45 and 46. A third NOR gate 55 is connected to the outputs of NOR gates 51 and 52. Assuming that positive logic is used, the output of a NOR gate is a logic 1 only if all inputs are at logic 0. Therefore, the output of NOR gate 51 will be a 1 only if the contents of flip-flops 42, 45 and 46 are at logic 0 and the output of NOR gate 52 is a 1 only if the contents of the flip-flops 42, 45 and 46 are a logic 1. Accordingly, the output of NOR gate 55 will be a logic 1 at all times except when all of the three flip-flops 42, 45 and 46 are the same. In that case, the output of NOR gate 55 becomes a logic 0. It may be seen, therefore, that the detector circuit 50 provides a logic 1 output when the contents of the three flip-flops 42, 45 and 46 are dissimilar, and a logic 0 when the contents of the three flip-flops are identical. This information, together with information about the polarity of the contents of the flip-flops provided on lines 56 and 57, is communicated to the pulse amplitude modulator 60. Modulator 60, by methods which will be described in more detail herein below, utilizes this information from the error signal e(t) to produce a signal which, when integrated by the circuit 40, closely approximates the analog signal applied to terminal 61. This synthesized signal from the integrator 40 is applied to the negative input of comparator 36 for further processing. The integrator circuit 40 may be composed of a simple resistor 62 and capacitor 65 connected in parallel to ground.

Figure 4:
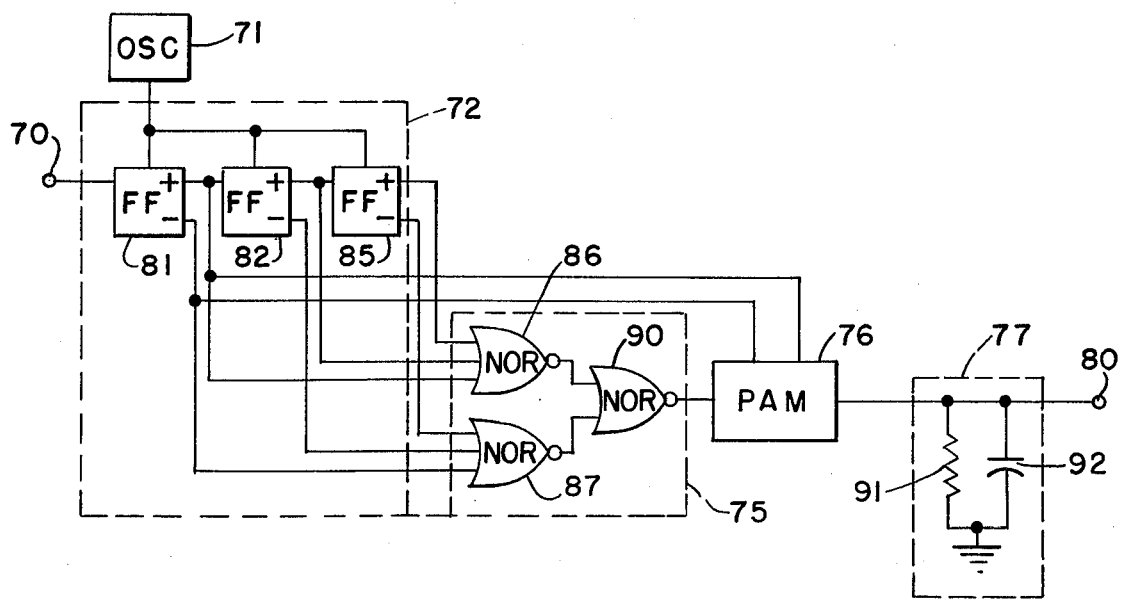
FIG. 4 is a more detailed diagram of the decoder of FIG. 2, including logic diagrams of certain portions thereof.

Referring to FIG. 4, a block/logic diagram of the decoder segment of a CVSD modulator is shown. Digital pulses applied to terminal 70 are clocked by an oscillator 71 into a sampler circuit 72 which is connected to a detector circuit 75. Based on information from the detector circuit 75, a pulse amplitude modulator 76 synthesizes a signal which, when passed through an integrator 77, provides an analog signal to terminal 80. The sampler circuit 72 consists of three flip-flops 81, 82 and 85 which are simultaneously clocked by pulses from oscillator 71. Digital pulses applied to the terminal 70 are sequentially shifted first into flip-flop 81 then into flip-flop 82, and finally to flip-flop 85. A detector circuit 75, consisting in this embodiment of three NOR gates 86, 87 and 90, is connected to the flip-flops of the sampler 72. Specifically, the positive output terminals of each of the flip-flops are connected to a first NOR gate 86, the negative output terminal of each of the three flip-flops are connected to a second NOR gate gates 86 and 87 are connected to a third NOR gate 90 whose output is connected to the pulse amplitude modulator 76. As described previously in the discussion of the detector circuit 50 of FIG. 3, the output of NOR gate 90 is a logic 0 only when the contents of all three flip-flops 81, 82 and 85 contain identical signals, either logic 1 or 0. At all other times the output of NOR gate 90 is a logic 1. The pulse amplitude modulator 76, which is discussed in greater detail herein below, operates on the signals from NOR gate 90 and from the positive and negative outputs of the flip-flop 81, to produce a signal which, when integrated by the circuit 77, is a substantially identical reconstruction of the original analog input signal. The integrator 77 may be constructed from a simple resistor 91 and capacitor 92 connected in parallel.

Figure 5:
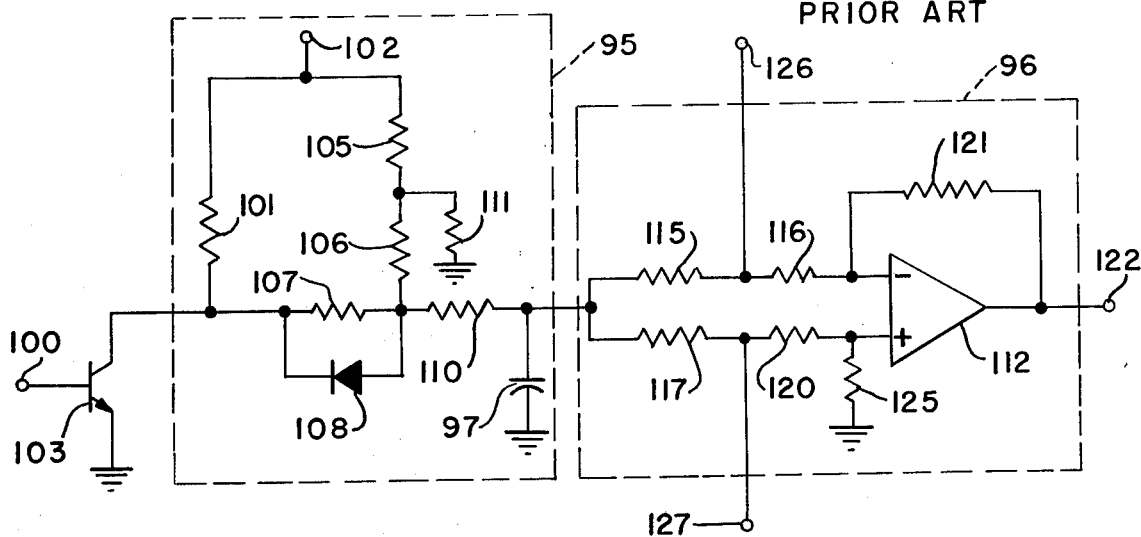
FIG. 5 is a schematic diagram of a pulse amplitude modulator described in the prior art.

Referring to FIG. 5, a slope command circuit 95 and pulse amplitude modulator 96 as constructed in the prior art are shown. The slope command circuit 95 serves the primary function of charging and discharging a capacitor 97 in response to a signal from a detector circuit (not shown) applied to a terminal 100. The terminal 100 is connected by a transistor 103 and a resistor 101 to a biasing voltage applied to a terminal 102, and through resistor to capacitor 97 and through diode 108 and resistor 110 to capacitor 97. The terminal 102 is connected through resistors 105 and 106 to a node separating resistors 107 and 110, and the node separating resistors 105 and 106 is connected through a resistor 111 to ground. The resistors 105, 106 and 111 comprise a voltage divising network which holds the capacitor 97 at a minimum charge when a logical 1 is present at terminal 100. The application at a logical 0 to terminal 100 turns transistor 103 off and further charges the capacitor 97 via resistor 101, diode 108 and resistor 110 at a rate determined by the circuit values. A logical 1 at terminal 100 turns transistor 103 on and thus allows capacitor 97 to discharge through resistors 110 and 107 and transistor 103 to the minimum voltage established by resistors 105, 106 and 111. The pulse amplitude modulator 96 commonly includes an operational amplifier 112 whose negative input is connected to the capacitor 97 through series-connected resistors 115 and 116. The positive input of the amplifier is similarly connected to the capacitor 97 through series-connected resistors 117 and 120. A resistor 121 couples the negative input of the operational amplifier to its output and terminal 122. The positive input of the amplifier is connected through a resistor 125 to ground. A terminal 126 provides electrical access to the node connecting resistors 115 and 116, and a terminal 127 provides electrical access to the node connecting resistors 117 and 120. As constructed, the voltage signal on the output 122 will be some positive multiple of the signal applied to the positive input of amplifier 112 when a ground potential is applied to terminal 126. The output signal at terminal 122 will be a negative multiple of the signal applied to the negative input of amplifier 112 when a ground potential is applied to the terminal 127. Factors of linearity require that the positive and negative multiples be substantially identical, requiring that the resistor values be closely controlled and matched. It is important to note that the signals applied to terminals 126 and 127 are, at all times, the complements of each other.

Figure 6:
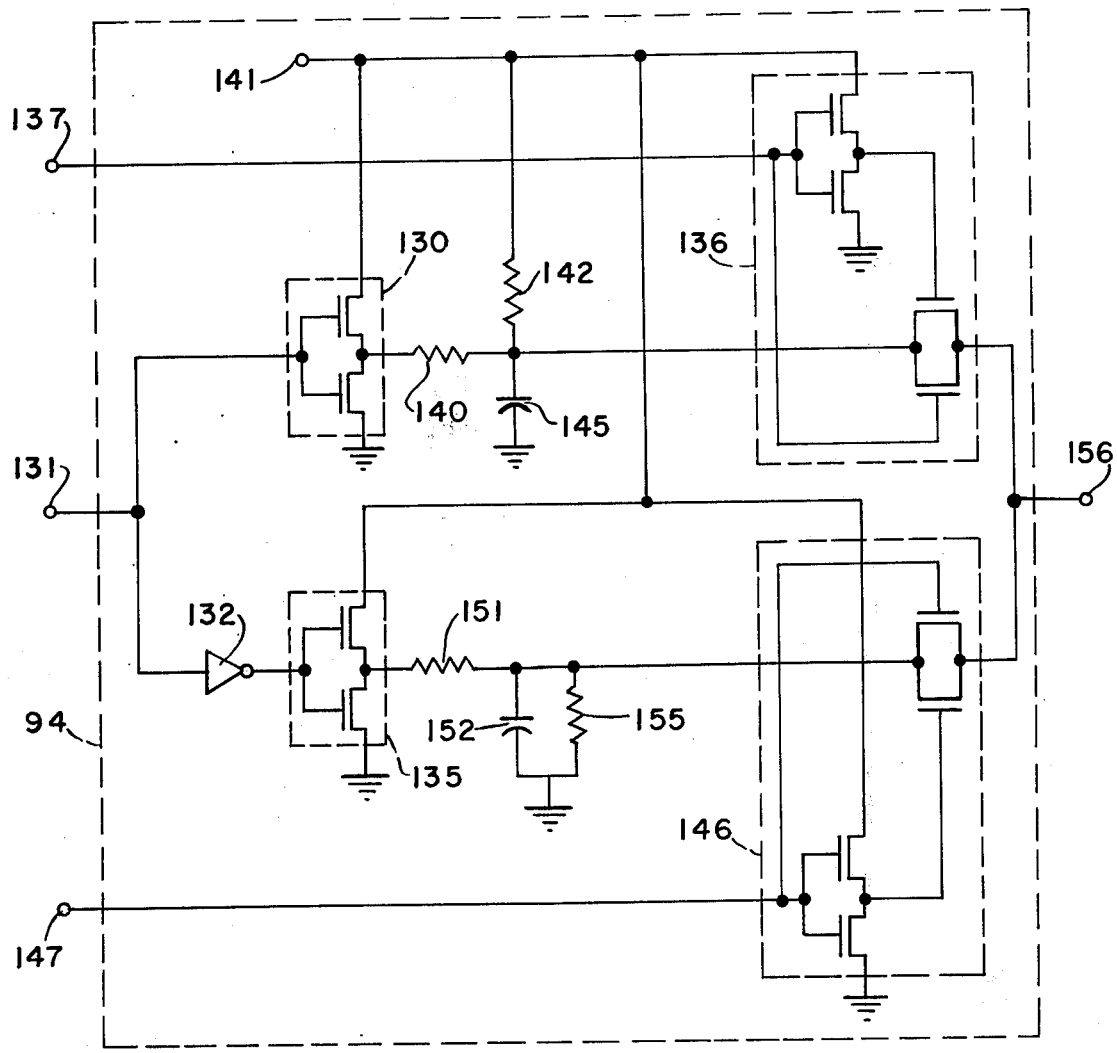
FIG. 6 is a schematic diagram of a preferred embodiment of the invention.

Referring to FIG. 6, an improved pulse amplitude modulator 94 is shown which may be substituted for the slope command circuit 95 and pulse amplitude modulator 96 of FIG. 5. The gate input of a C-MOS buffer 130, such as an RCA type CD4041A, is connected to an input terminal 131. The input terminal 131 is also connected through an inverter 132 to the gate input of a second buffer 135. The control voltage input of a C-MOS bilateral switch 136, such as an RCA type CD4066, is connected to an input terminal 137. A resistor 140 connects the output of buffer 130 to the signal input of the switch 136. A terminal 141 connects the bias voltage input of the buffer 130, the bias voltage input of the switch 136, and through a resistor 142 to the control input of the switch 136. The control input is additionally connected through a capacitor 145 to ground. The control voltage input of a second bilateral switch 146 is connected to an input terminal 147. The bias voltage input of switch 146 is connected to a terminal 141 as is the bias voltage input of the buffer 135. The output of buffer 135 is connected through a resistor 151 to the input signal line of switch 146, through a capacitor 152 to ground and through a resistor 155 to ground. The outputs of switches 136 and 146 are connected to a terminal 156. For operation in the CVSD modulator of FIG. 3, the input terminal 137 is connected to the positive output of flip-flop 42, terminal 147 is connected to the negative output of flip-flop 42, and terminal 131 is connected to the output of the detector circuit 50. A biasing potential is applied to the terminal 141. The output terminal 156 is connected to the input of the integrator circuit 40. Generally, the modulator circuit 94 functions by charging and discharging capacitors 145 and 152 in accordance with input signals supplied to the modulator. If the input to terminal 131 is a logic 1, the buffer 130 establishes a path to ground for resistor 140, and capacitor 145 is discharged to a voltage which is a fixed percentage greater than ½ the bias voltage. Resistor 140 thus is larger than resistor 142 and their ratio establishes the minimum discharge voltage. Conversely, the logic 1 on input terminal 131 is inverted by inverter 132 and applies a logic 0 to buffer 135. This establishes a path through resistor 151 to the bias voltage, and capacitor 152 charges to a voltage which is a fixed percentage less than ½ the bias voltage. Resistor 151 is greater than resistor 155 and their ratio establishes the maximum charge voltage on capacitor 152. In order to maintain a balanced modulation, resistors 140 and 151 must have substantially identical values, as must have resistors 142 and 155 and capacitors 145 and 152. Thus, a logic 1 on terminal 131 establishes the minimum modulation voltage centered around the norm at ½ the bias voltage.

If the input to terminal 131 is a logic 0, the buffer 130 establishes a path for resistor 140 to the bias voltage, and capacitor 145 charges to the bias voltage. Conversely, buffer 135 establishes a path for resistor 151 to discharge capacitor 152 to ground. Thus a logic 0 on terminal 131 establishes the maximum modulation voltage centered around the norm of ½ the bias voltage.

The voltage on capacitor 145 is called $V_H$ and the voltage on capacitor 152 is $V_L$. The voltage signal applied to the output terminal 156 will be the instantaneous voltage on capacitor 145, defined $V_H$, or the voltage on capacitor 152, defined $V_L$, depending on the signal applied to input terminals 137 or 147. Specifically, if a logic 1 is applied to terminal 137, the voltage on capacitor 145 will pass through the switch 136 to the output terminal 156. If the signal on terminal 137 is a logic 0, the switch 136 will be off. If a logic 1 is applied to terminal 147, the switch 146 will be on, allowing the voltage on the capacitor 152 to pass through the switch to the output terminal 156. If a logic 0 is applied to terminal 147, switch 146 will be turned off. Because terminal 137 is connected to the positive output of flip-flop 42, and terminal 147 is connected to the negative output of flip-flop 42, one of the terminals 137 or 147 will be at logic 1 and the other terminal will be at logic 0 at all times. Therefore, the signal on terminal 156 will be the instantaneous voltage on either capacitor 145 or 152 at all times.

The foregoing specification describes only a preferred embodiment of my invention, and it is intended that the invention be limited only as defined in the appended claims.

I claim:

1. A pulse amplitude modulator, comprising:
   a source of first digital signals representative of the polarity of the error between a first analog signal and a second, synthesized, analog signal;
   a source of second digital signals representative of the presence or absence of a predetermined number of like consecutive bits within said first digital signals;
   an output terminal;
   a capacitor circuit responsive to said second digital signals and including:
   means for generating and storing a first voltage, $V_H$, said voltage increasing at a predetermined rate when a presence of like consecutive bits is detected and decreasing when an absence of like consecutive bits is detected, and
   means for generating and storing a second voltage, $V_L$, said voltage decreasing at a predetermined rate when a presence of like consecutive bits is detected and increasing when an absence of like consecutive bits is detected, and
   means responsive to said first digital signals for selectively routing $V_H$ or $V_L$ to the output terminal, the choice of said selection being determined by the polarity of the error.

2. In a signal processing system wherein an input analog signal is compared with a synthesized signal, the detected error being used to correct the synthesized signal, a pulse amplitude modulator comprising:
   a source of first signals representative of the polarity of said error;
   a source of second signals representative of the presence or absence of a predetermined number of like consecutive bits within said first signals;
   an output terminal;
   a capacitor circuit responsive to said second signals and including:
   means for generating and storing a first voltage, $V_H$, said voltage increasing at a syllabic rate when a presence of like consecutive bits is detected and decreasing when an absence of like consecutive bits is detected, and
   means for generating and storing a second voltage, $V_L$, said voltage decreasing at a syllabic rate when a presence of like consecutive bits is detected and increasing when an absence of like consecutive bits is detected, and
   means responsive to said first signals for selectively routing $V_H$ or $V_L$ to the output terminal, the choice of said selection being determined by the polarity of the error.

3. In a signal processing system wherein an analog output signal is reconstructed from first digital signals representative of the polarity of the error between a known analog signal and a previously reconstructed analog signal; pulse amplitude modulator comprising:
   a source of said first signals;
   a source of second signals representative of the presence or absence of a predetermined number of like consecutive bits within said first signals;
   an output terminal;
   a capacitor circuit responsive to said second signals and including
   means for generating and storing a first voltage, $V_H$, said voltage increasing at a predetermined rate when a presence of like consecutive bits is detected and decreasing when an absence of like consecutive bits is detected, and
   means for generating and storing a second voltage, $V_L$, said voltage decreasing at a predetermined rate when a presence of like consecutive bits is detected and increasing when an absence of like consecutive bits is detected, and
   means responsive to said first signals for selectively routing $V_H$ or $V_L$ to the output terminal, the choice of said selection being determined by the polarity of the error.

* * * * *